United States Patent
Geedh et al.

(10) Patent No.: US 12,210,766 B2
(45) Date of Patent: Jan. 28, 2025

(54) TEST MODE STATE MACHINE FOR A MEMORY DEVICE

(71) Applicant: Micron Technology, Inc., Boise, ID (US)

(72) Inventors: Rucha Deepak Geedh, Folsom, CA (US); Manjinder Singh Bains, Yuba City, CA (US); Roopal Amit Patel, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 310 days.

(21) Appl. No.: 17/830,169

(22) Filed: Jun. 1, 2022

(65) Prior Publication Data

US 2023/0393774 A1    Dec. 7, 2023

(51) Int. Cl.
*G06F 3/06* (2006.01)
*G06F 11/22* (2006.01)
*G06F 11/273* (2006.01)
*G11C 29/12* (2006.01)

(52) U.S. Cl.
CPC .......... *G06F 3/0653* (2013.01); *G06F 3/061* (2013.01); *G06F 3/0655* (2013.01); *G06F 3/0679* (2013.01); *G06F 11/2221* (2013.01); *G06F 11/2273* (2013.01); *G06F 11/273* (2013.01); *G11C 29/12* (2013.01)

(58) Field of Classification Search
CPC ...... G06F 3/0653; G06F 3/061; G06F 3/0655; G06F 3/0679; G06F 11/2221; G06F 11/2273; G06F 11/273; G11C 29/12
See application file for complete search history.

(56) References Cited

U.S. PATENT DOCUMENTS

| | | | |
|---|---|---|---|
| 6,675,336 B1* | 1/2004 | Thakur | G11C 29/12 714/733 |
| 9,368,212 B1* | 6/2016 | Pan | G11C 29/028 |
| 2013/0124932 A1* | 5/2013 | Schuh | G11C 29/16 714/718 |
| 2023/0350606 A1* | 11/2023 | Hsu | G06F 3/0659 |

* cited by examiner

*Primary Examiner* — Daniel F. McMahon
(74) *Attorney, Agent, or Firm* — Greenberg Traurig

(57) ABSTRACT

Systems, methods, and apparatus for a memory device having test mode state machines configured to perform self-testing. In one approach, a memory array has memory cells. Periphery logic of the memory device receives a command from a host device to initiate self-testing. The periphery logic generates trigger signal(s) in response to receiving the command. Control circuitry (e.g., a controller) has state machine(s) that receives the trigger signal(s) and initiates execution of a command sequence. The command sequence includes various orders of operations such as read, write, or delay. A state machine can be integrated into each of multiple partitions of the memory array.

31 Claims, 7 Drawing Sheets

| int_algo_mode_en | a_en | b_en | c_en | Output |
|---|---|---|---|---|
| 0 | X | X | X | FSM off |
| 1 | 1 | 0 | 0 | Run A → Idle |
| 1 | 1 | 1 | 0 | Run A → B → Idle |
| 1 | 1 | 1 | 1 | Run A → B → C → Idle |
| 1 | 0 | X | X | Invalid/ Waits in Idle |
| 1 | 1 | 0 | X | Invalid/ Run A → Idle |

FIG. 5

| int_a/b/c_cmd [2:0] | Command Opcode |
|---|---|
| 001 | Read |
| 101 | Refresh |
| 010 | Write |
| 011 | Force Write |

FIG. 6

TEST MODE STATE MACHINE FOR A MEMORY DEVICE

FIELD OF THE TECHNOLOGY

At least some embodiments disclosed herein relate to memory devices in general, and more particularly, but not limited to a memory device including one or more test mode state machines.

BACKGROUND

A computing system can include one or more memory devices that store data. The memory devices can be, for example, non-volatile memory devices and volatile memory devices. In general, a host system can store data at the memory devices and retrieve data from the memory devices.

Memory devices include various types of non-volatile storage devices used to store data. For example, non-volatile storage devices include NAND flash memory devices. NAND flash is a type of flash memory constructed using NAND logic gates. Alternatively, NOR flash is a type of flash memory constructed using NOR logic gates.

Memory devices are typically tested for defects after manufacture. Production testers are often used to perform the testing (e.g., during assembly). In one example, the memory devices are integrated circuit chips manufactured in a semiconductor manufacturing facility. The chips are sent to an assembly and testing facility, where the testing is performed.

In some cases, a memory device incorporates built-in self-test (BIST) functionality so that the memory device itself can perform many operations to support testing of the memory device. In one example, a production tester sends a signal to the memory device to initiate the BIST on a memory device chip. The memory device provides a result (e.g., a data array) to the production tester that is obtained from running the BIST.

BRIEF DESCRIPTION OF THE DRAWINGS

The embodiments are illustrated by way of example and not limitation in the figures of the accompanying drawings in which like references indicate similar elements.

FIG. 5 shows exemplary state machine outputs based on configuration bit inputs, in accordance with some embodiments.

FIG. 6 shows exemplary opcodes for test mode configuration and operations corresponding to the opcodes, in accordance with some embodiments.

DETAILED DESCRIPTION

Figure 1:
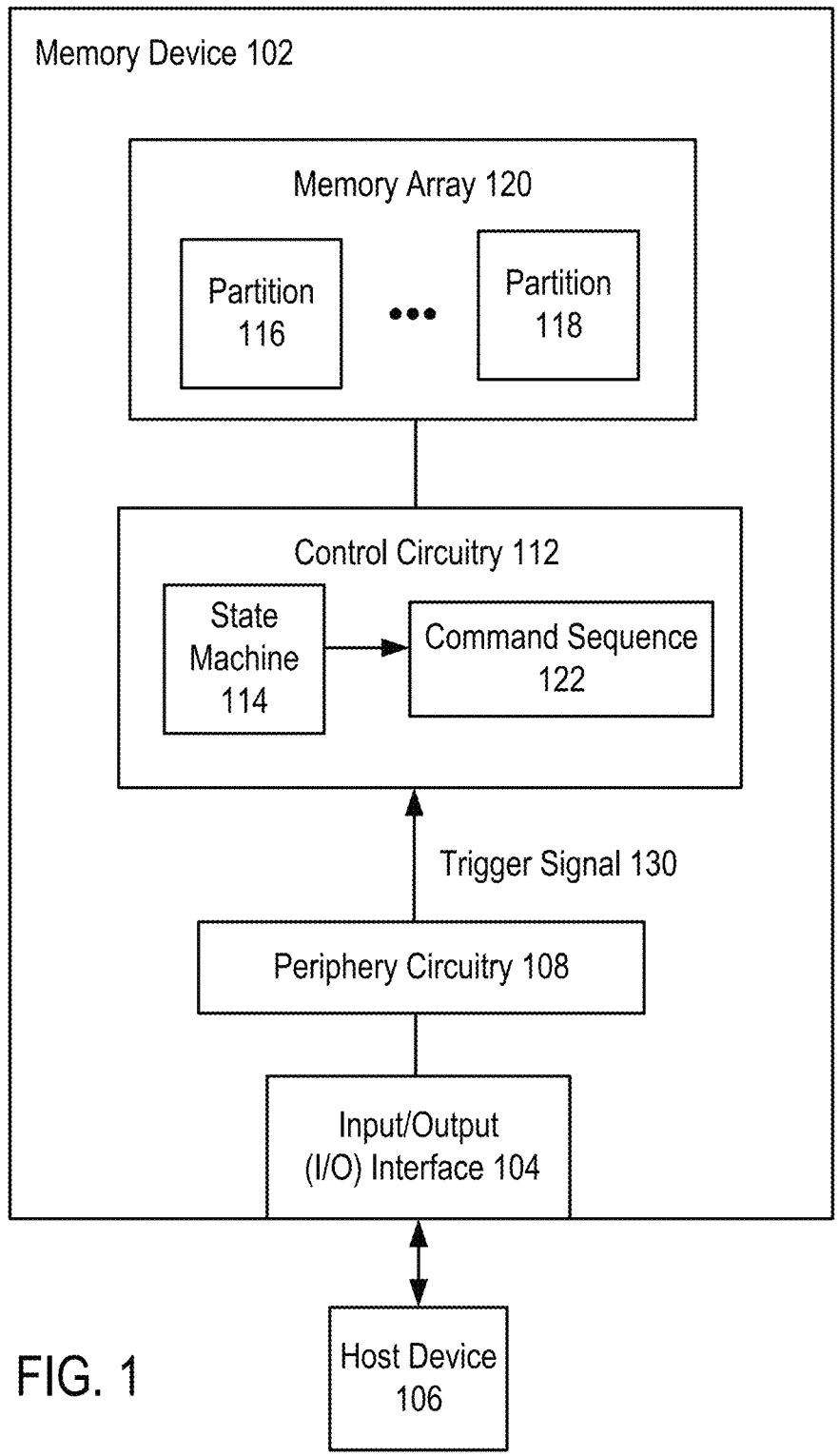
FIG. 1 shows a memory device including a state machine used during a test mode, in accordance with some embodiments.

The following disclosure describes various embodiments for a memory device including one or more state machines used to implement a test mode (e.g., built-in self-test). In one example, the memory device is a phase change memory device. In one example, the memory device uses bipolar chalcogenide memory. In one example, the memory device has a three-dimensional cross-point architecture. In other examples, the memory device can be yet other types of memory including NAND flash.

The memory device may, for example, store data used by a host device (e.g., a computing device of an autonomous vehicle, or another computing device that accesses data stored in the memory device). In one example, the memory device is a solid-state drive mounted in an electric vehicle (e.g., auto, drone, boat).

When testing memory devices using some types of memory cells, the timing delay used between various operations (e.g., read or write operations) performed during the testing can be critical. For example, when testing memory devices using chalcogenide memory cells, proper testing sometimes requires that a short delay time(s) period be interspersed between various sequences of read and/or write operations. In one example, this delay can be short, such as one microsecond or less.

However, existing production testers are limited in the ability to implement testing sequences that include read and/or write operations with such short time delays between the operations. For example, a testing protocol for a memory device might require using three commands: issuing a write command, issuing a delay command, and then issuing a read command (e.g., the read or write commands are given to an integrated circuit chip under test). However, existing production testers are not able to handle short delays such as 1 microsecond (µs) or less.

The inability of existing production testers to handle short delays as described above requires manual modification of microcode used on the memory device in order to properly run the test. For example, the memory device can include microcode for implementing a read operation, microcode for implementing a write operation, and microcode for implementing a time delay between read or write operations. This manual modification of the microcode is done prior to testing, and then the modified microcode is loaded onto the memory device for performing the testing.

The above modification of the microcode is time-consuming and can be prone to error due to repeated modifications that are required over time (e.g., as memory device or manufacturing conditions change). In some cases, the microcode might need to be modified weekly in a commercial production testing facility. This creates the technical problem of reducing throughput of an assembly manufacturing line. This also creates the technical problem of increasing the probability of failure to properly test memory devices after manufacturing and prior to shipment to customers.

There are also other limitations associated with existing production testers. For example, in one testing flow, an external write command is issued to a chip, then a manual delay is implemented, and then a write command is issued again. Controlling voltages on the chip during such testing is difficult. For example, there are hard-coded gates that block control of certain voltages for testing. Thus, implementing such test command sequences by issuing external commands to a chip is difficult and limited in flexibility as to the robustness of testing.

In addition to the limitations of existing production testers above, prior memory devices themselves have limitations that make testing difficult. For example, existing memory devices do not support a multi-command testing mode. For example, it is not possible to issue a sequence of read/write operations to periphery logic of a memory device with a single command. Instead, each read/write operation must be issued individually to fully and properly run testing. Thus, various technical problems are countered when testing existing memory devices.

In one example of the above problems when doing testing, configuring a write operation while in a read mode of a memory device is difficult. Similarly, configuring a read operation while in a write mode when doing testing is difficult. For example, command specific decoding in core circuits of the memory device block voltage control. Also, word line and bit line decoders may stay on while performing microcode for a read mode or a write mode. This prevents readily using more complex read/write sequences for testing memory cells.

In another example of the above problems, some types of phase change memory cells (e.g., chalcogenide memory cells) require that testing use multiple pulses in one command. In one example, a testing sequence includes write-set/read/write-reset operations in a single sequence. Existing memory devices and production testers are not able to adequately implement such testing sequences.

To address these and other technical problems, a state machine is used in a memory device for testing (e.g., when the memory device is operating in a test mode). The state machine can queue multiple commands (e.g., two or more commands in a defined sequence). In one embodiment, a command sequence is executed by the state machine in response to a triggering event. In one embodiment, the triggering event is the state machine receiving a trigger signal. For example, the trigger signal can be received by the state machine from periphery logic of the memory device that communicates with a host device. In one example, the trigger signal is a command enable signal generated by the periphery logic (e.g., based on communication with the host device).

In one example, the periphery logic generates the trigger signal in response to receiving a signal from the host device. In one example, the signal from the host device is a test mode sequence received via an input/output (I/O) interface of the memory device.

In one embodiment, a memory device has multiple partitions (e.g., 32 partitions). A dedicated test mode state machine as described herein is included in each of the partitions. The state machine uses values stored in configurable registers of the partition as inputs to control the state machine. In one example, the state machine is included in partition control logic (PLC) for each partition. The commands queued up by the state machine can be configured with test mode registers of the respective partition. In one example, periphery logic of the memory device sends a command enable signal to each state machine. Addresses (e.g., x/y addresses of a memory array) are provided with the command enable signal.

In one embodiment, a memory device includes an input/output (I/O) interface configured to communicate with a host device. Periphery circuitry (e.g., periphery logic) receives a test mode sequence from the host device via the I/O interface. The periphery circuitry generates a trigger signal (e.g., a command enable or other type of signal) in response to receiving the test mode sequence.

The memory device has control circuitry (e.g., partition control logic) to receive the trigger signal. The control circuitry includes a state machine configured to initiate execution of a command sequence upon receiving the trigger signal.

The memory device includes a memory array having memory cells. For example, each cell has a unique address, and the command sequence comprises operations performed on the memory cells. In one embodiment, the trigger signal initiates a built-in self-test (BIST) process for the memory device.

In one embodiment, a state machine of a partition receives a single command enable signal. In response to receiving the command enable signal, the state machine runs multiple commands (e.g., write, delay, read). In one embodiment, the command enable signal is generated in response to receiving a command from a host device (e.g., receiving a read command). Being able to run the multiple commands speeds up the testing of the memory device. In one embodiment, the state machine in each partition is dedicated solely to testing of the memory device (e.g., is not used in user mode by a user).

Various advantages are provided by at least some embodiments described herein. In one advantage, the above modification of the microcode done for testing prior memory devices on existing production testers is not required. For example, the microcode on the memory device that is run during testing in a test mode is the same microcode run on the memory device when used by a user in normal user mode. In other words, the microcode for testing is the same as the microcode in the product shipped to customers. In some cases, an advantage is that memory space required on the memory device chip can be reduced as the microcode is less complex than with existing memory devices.

FIG. 1 shows a memory device 102 including a state machine 114 used during a test mode, in accordance with some embodiments. Memory device 102 has an input/output (I/O) interface 104 that communicates with a host device 106. Periphery circuitry 108 receives signals from host device 106 via I/O interface 104. In one example, these received signals include a test mode sequence. In one example, the test mode sequence specifies an order of commands, memory addresses or other memory locations (e.g., portions, regions, or partitions), and/or parameters associated with testing to be executed.

Periphery circuitry 108 generates trigger signal 130 in response to receiving a signal from host device 106. In one example, trigger signal 130 is generated in response receiving a test mode sequence.

Memory array 120 has partitions 116 . . . 118. In one example, the test mode sequence indicates selected partitions of memory array 120 to which a respective trigger signal 130 is provided. In one example, a trigger signal is not provided to non-selected partitions.

Control circuitry 112 receives trigger signal 130 from periphery circuitry 108. Control circuitry 112 controls various operations associated with memory array 120. These operations include, for example, read and write operations. In one example, the write operations include programming memory cells of memory array 120.

Control circuitry 112 includes at least one state machine 114, which initiates execution of command sequence 122 upon receiving trigger signal 130. Command sequence 122 specifies an order of various operations to be performed during testing of memory device 102. This testing includes applying voltages to access lines used to access memory cells in memory array 120. These access lines include, for example, word lines and bit lines.

In one embodiment, control circuitry 112 is located in partition 116 and/or partition 118. In one example, all partitions of memory array 120 include an instance of control circuitry 112. In one embodiment, state machine 114 is configured differently for at least a portion of the partitions of memory array 120. In one example, this different configuration can be different voltages and/or timing to use for read and/or write operations. In one example, this different configuration can be based on a different error rate associated with given partitions (e.g., an error rate determined during prior testing and/or determined from field experience with other similar memory devices). In one example, this different configuration can be based on a different level of wear associated with given partitions. In one example, this different configuration can be based on different types of memory cells in a given partition. In one embodiment, testing is performed more than once during the life of the memory device (e.g., after a user has operated in user mode).

In one example, periphery circuitry 108 issues trigger signal 130 for all 32 partitions of a memory array. Periphery circuitry 108 loops through multiple x/y addresses/cycles to perform testing of a memory device. In one example, a trigger signal 130 is issued for each of the partitions. The issuance of the trigger signal 130 can be in parallel to all partitions or staggered sequentially in time with a delay between issuance of each trigger signal 130.

In one embodiment, after testing is completed, a data result from testing is provided to host device 106 via I/O interface 104. In one example, the data result is in reply to receiving the test mode sequence. In one example, the data result is one or more values read from memory cells of memory array 120. In one example, the data result indicates a result from a comparison of expected data to received data (e.g., data read from memory array 120).

Figure 2:
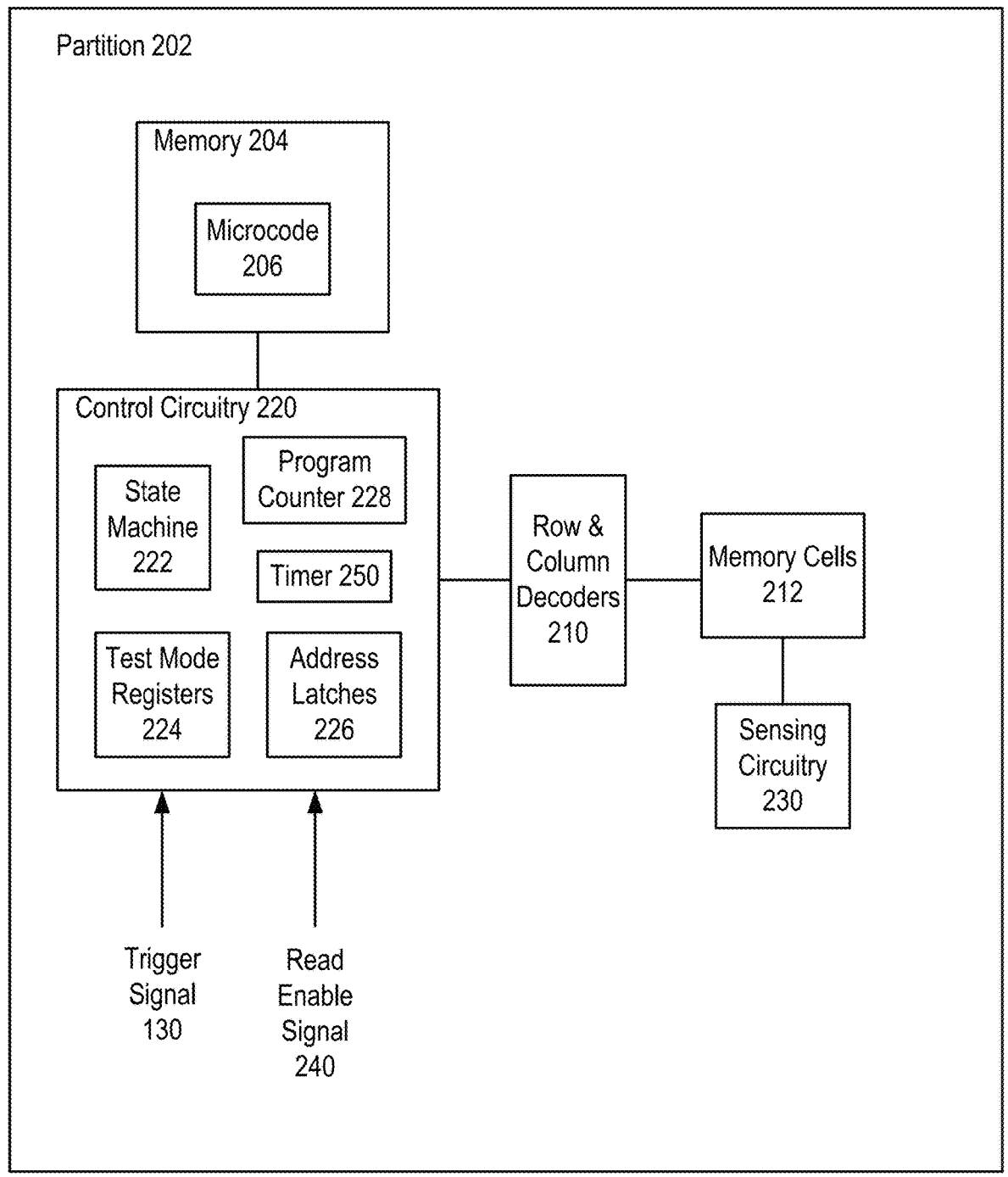
FIG. 2 shows a partition of a memory array including control circuitry used to perform testing based on parameters stored in test mode registers, in accordance with some embodiments.

FIG. 2 shows a partition 202 of a memory array including control circuitry 220 used to perform testing based on parameters stored in test mode registers 224, in accordance with some embodiments. In one example, the memory array is memory array 120. Partition 202 is an example of partitions 116 . . . 118. Control circuitry 220 is an example of control circuitry 112.

Control circuitry 220 receives trigger signal 130 and read enable signal 240. In one example, trigger signal 130 is received from periphery circuitry 108. In one example, read enable signal 240 is received from periphery circuitry 108. In one example, read enable signal 240 is used to sense data in memory cells at an appropriate time based on functional or other characteristics of the memory cells (e.g., electrical behavior of chalcogenide cells). In one example, timing of the read enable signal 240 relative to the trigger signal 130 is controlled to correspond to this appropriate timing. In one example, this timing can be varied based on different characteristics of various memory cells in the memory array. In one example, this timing is varied based on performance characteristics such as error rates, and/or wear levels associated with certain types of memory cells or memory partitions.

In response to receiving read enable signal 240, control circuitry 220 causes sensing circuitry 230 to sense data stored in memory cells 212. In one example, sensing circuitry 230 includes one or more sense amplifiers.

Control circuitry 220 provide signals to row and column decoders 210 to access memory cells 212. This access can be, for example, for reading memory cells 212 and/or writing memory cells 212.

Control circuitry 220 includes state machine 222. State machine 222 is an example of state machine 114. Microcode 206 is stored in memory 204 of partition 202. Microcode 206 is executed by state machine 222 to run read, write, and/or delay operations associated with memory cells 212. In one example, memory 204 is SRAM.

Control circuitry 220 includes test mode registers 224 and address latches 226. In one embodiment, test mode registers 224 store data received with trigger signal 130. This data includes parameters used to configure testing performed by state machine 222. These parameters include, for example, sequences of command operations to be performed during testing. These parameters can also include voltages to be applied during read or write operations, and/or timing associated with delays incorporated into stages or phases of command operation sequences. In one example, the address latched by address latches 226 for a read or write command corresponds to 128 bits of data in a memory array. In one example, these bits of data are configured across 128 tiles of a three-dimensional memory array.

Figure 3:
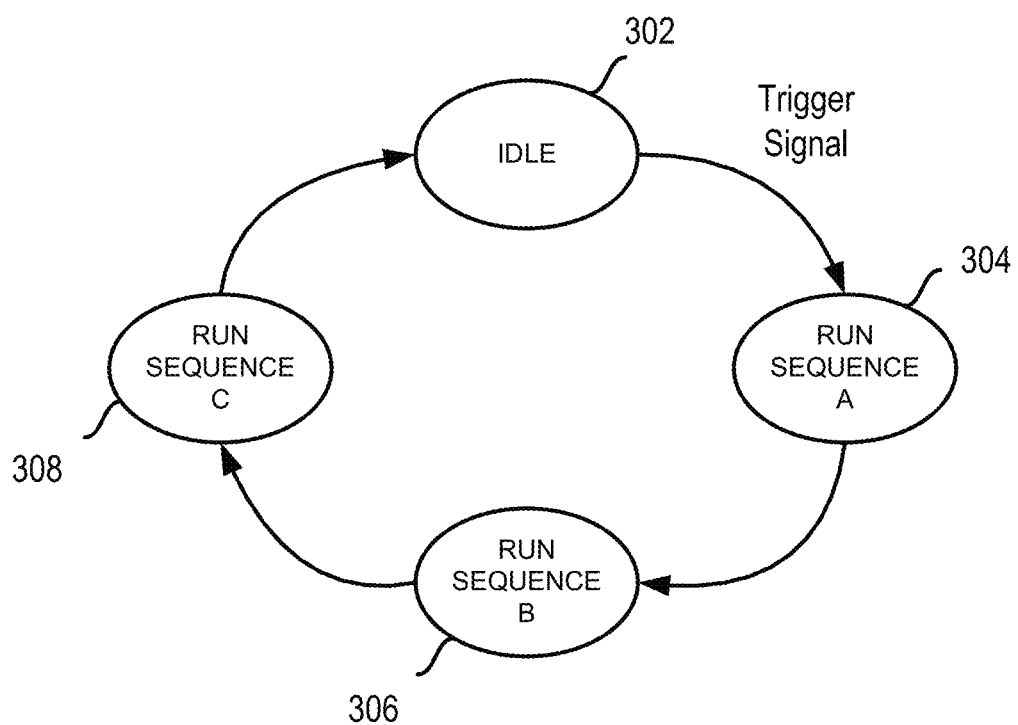
FIG. 3 shows an exemplary state diagram for a state machine, in accordance with some embodiments.

Control circuitry 220 also includes program counter 228 and timer 250. Program counter 228 is updated by state machine 222 (e.g., when a state changes as illustrated in FIG. 3) to cause execution of a portion of microcode 206 corresponding to a read, write, or delay operation to be executed.

In one embodiment, timer 250 is used as a counter to implement a configurable time delay between receiving trigger signal 130 and receiving read enable signal 240. The time delay can be configured by control circuitry 220 based on data received from host device 106.

In one embodiment, a memory array has multiple partitions each configured similarly to partition 202. Each such partition can be configured uniquely for testing based on parameters received from periphery circuitry 108. The parameters provided by periphery circuitry 108 can be based on configuration data received from host device 106.

In one embodiment, test mode registers 224 store parameters provided by periphery circuitry (e.g., 108) of a memory device. In one example, these parameters are provided with trigger signal 130. The parameters specify an order of operations in a command sequence to be executed by state machine 222. In one example, the operations are specified using opcodes defined by defined bits in test mode registers 224. In one example, the parameters specify one or more voltages (e.g., read or write voltage to apply to selected memory cells) corresponding to operations in the command sequence. In one example, the parameters specify data to be written into memory cells 212 when performing a write operation of the command sequence.

In one example, test mode registers 224 store parameters to configure a command sequence as follows: write-set, delay, read. Between the write-set and read operation, there is a delay operation. The word lines and bit lines used to access the memory cells under test are discharged during the delay operation.

In one example, test mode registers 224 store parameters to configure a command sequence as follows: write-reset, delay, read. The word lines and bit lines are discharged during the delay operation similarly as described above.

FIG. 3 shows an exemplary state diagram for a state machine, in accordance with some embodiments. In one example, the state diagram illustrates states cycled through by state machine 114 or state machine 222.

As illustrated, the state machine cycles through states 302, 304, 306, 308. The state machine begins in idle state 302. In response to receiving a trigger signal, the state machine changes from state 302 to state 304. In one example, the trigger signal is trigger signal 130 from periphery circuitry 108.

The changing of states by the state machine from state 304 to state 306 to state 308 corresponds to execution of a command sequence of operations, such as discussed above.

In one example, the command sequence is command sequence 122 executed by state machine 114.

In one example, the changing of states corresponds to execution of a command sequence as follows: read, delay, write. A read operation is performed in state 304, a delay operation is performed in state 306, and a write operation is performed in state 308. The state machine cycles from state 304 to state 306 after the read operation is determined by control circuitry 220 to have been completed (e.g., sensing circuitry 230 indicates that a data output has been obtained). The state machine cycles from state 306 to state 308 after determining that the delay operation is completed (e.g., based on timer 250 or another timer). The state machine cycles from state 308 to idle state 302 after determining that the write operation is completed.

Each of these operations is performed based on configuration parameters stored in test mode registers 224. The operations are performed on memory cells 212 corresponding to addresses that are stored in address latches 226. After the operations are completed and the state machine has cycled to state 302, a data result from the execution of the command sequence is returned to host device 106 through periphery circuitry 108. Although three operations are illustrated in this exemplary command sequence, other state machines can execute any number of operations in command sequence as may be desired for a particular implementation.

In one example, control circuitry 220 updates program counter 228 to cause execution of a portion of microcode 206 that corresponds to the read, write, delay, or other command being executed in the current state of the state machine. Program counter 228 is updated in response to a change in state of the state machine to the next state for which the command is to be executed. In one example, program counter 228 is updated based on an opcode read from configuration bits stored in test mode registers 224.

In one example, once a trigger signal is received by control circuitry 220, the state machine latches a memory address in one or more of address latches 226 and then runs the commands in a command sequence configured by or received from periphery circuitry 108. After completing the command sequence, the state machine returns to idle state 302 and waits for the next trigger signal from periphery circuitry 108.

In one example, a trigger signal is sent for each memory address. Opcodes, voltages, and other parameters can be configured for each state of the state machine. One of the opcodes can correspond to a time delay. In one example, the time delay is implemented as a wait in microcode (with a time delay that is specified by one of the testing parameters). In one example, the voltages correspond to voltages applied to word lines and bit lines used to access memory cells 212. Control circuitry 220 controls the voltages that are applied to the word lines and bit lines.

Figure 4:
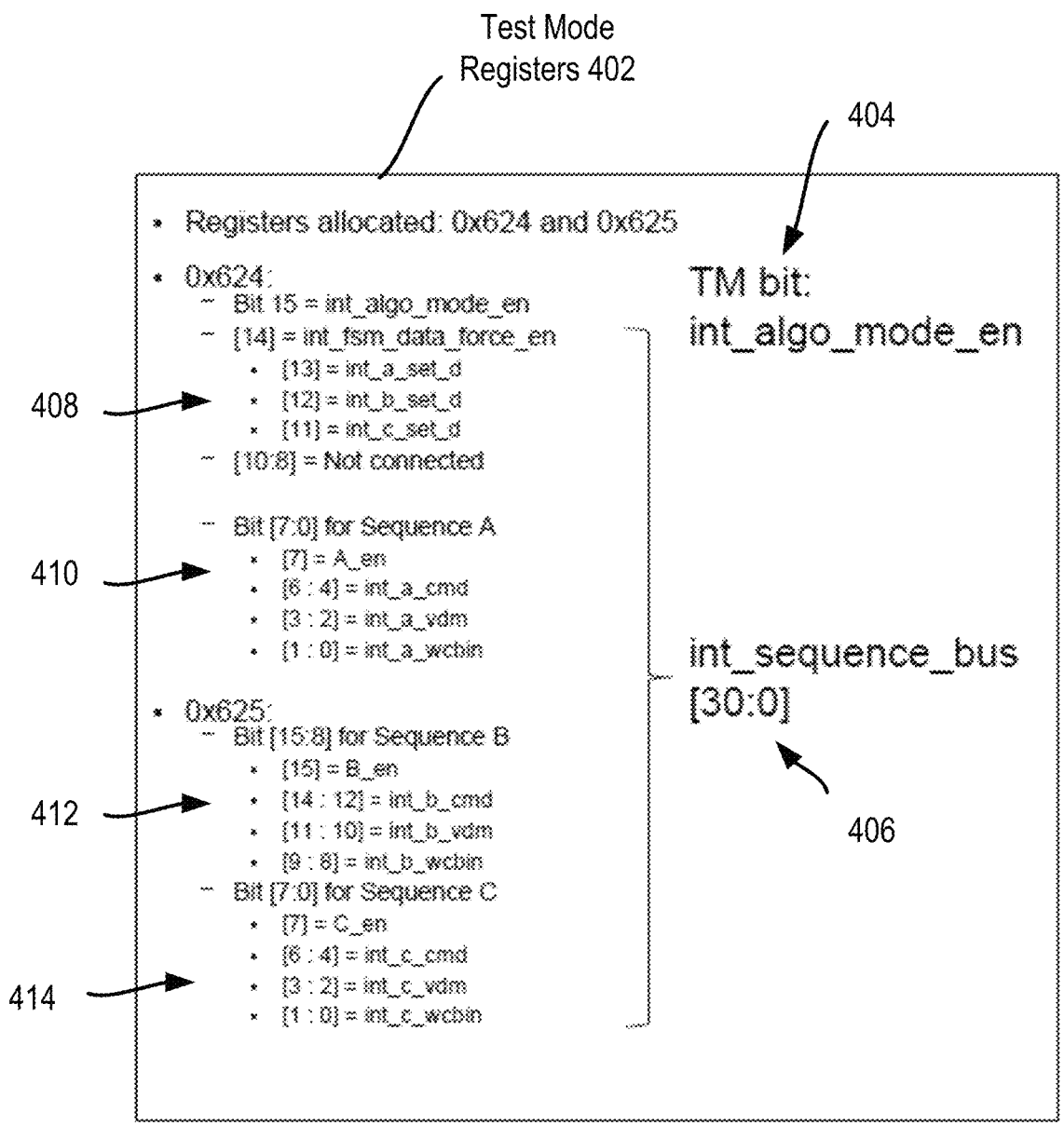
FIG. 4 shows exemplary configuration bits stored in test mode registers in accordance with some embodiments.

FIG. 4 shows exemplary configuration bits stored in test mode registers 402, in accordance with some embodiments. In one example, test mode registers 402 correspond to test mode registers 224. In one example, 32 bits are stored as illustrated in FIG. 4.

The configuration bits include a test mode enable bit 404 and other configuration bits 406 corresponding to various parameters used to configure a state machine (e.g., state machine 114 or 222). In one example, test mode enable bit 404 is used to turn state machine 222 on and off. Configuration bits 406 include, for example, bits 408, 410, 412, 414.

Bits 408 correspond to data to be used during performance of a command. For example, the data specifies a value to be set or reset for a memory cell.

Bits 410, 412, 414 correspond to parameters for a specific command to be executed by a state machine of a given partition. For example, bits 410 specify an opcode that identifies the command, and a voltage (e.g., word line voltage) that corresponds to execution of the command. For example, bits 410 correspond to execution of a command in state 304 of FIG. 3. For example, bits 412 correspond to execution of a command in state 306 of FIG. 3.

FIG. 5 shows exemplary state machine outputs 510 based on values of configuration bit inputs 502, 504, 506, 508, in accordance with some embodiments. In one example, outputs 510 indicate the action(s) performed by state machine 222 in response to configuration bit inputs. Inputs 502 correspond to values of test mode enable bit 404.

Inputs 504, 506, 508 correspond to values of an enable bit for each of various commands configured by test mode registers 402. For example, input 504 corresponds to an enable bit (bit 7=A_en for Sequence A in FIG. 4) of configuration bits 410. Inputs 506, 508 correspond similarly to corresponding enable bits as illustrated in FIG. 4. In one example, if any particular state of the state machine is not enabled, then that state is skipped during execution of a command sequence.

FIG. 6 shows exemplary opcodes 602 for test mode configuration and operations 604 corresponding to the opcodes 602, in accordance with some embodiments. In one example, opcodes 602 are provided by configuration bits in test mode registers 402. For example, configuration bits 410 provide an opcode having three bits (e.g., [6:4]=int_a_cmd) that identify a command to be performed.

In one example, command identified by opcodes 602 is a read, refresh, write, or force write operation. In one embodiment, these operations are performed in the same way by the state machine for a test mode of operation by a memory device as control circuitry performs the operation for a user mode of the memory device (e.g., the microcode for test mode is identical to the microcode for user mode).

In another embodiment, one or more of these operations can be different for a test mode as compared to a user mode. For example, a read operation while in a test mode for a particular memory cell can be performed differently than a read operation while in a user mode for the same memory cell.

Figure 7:
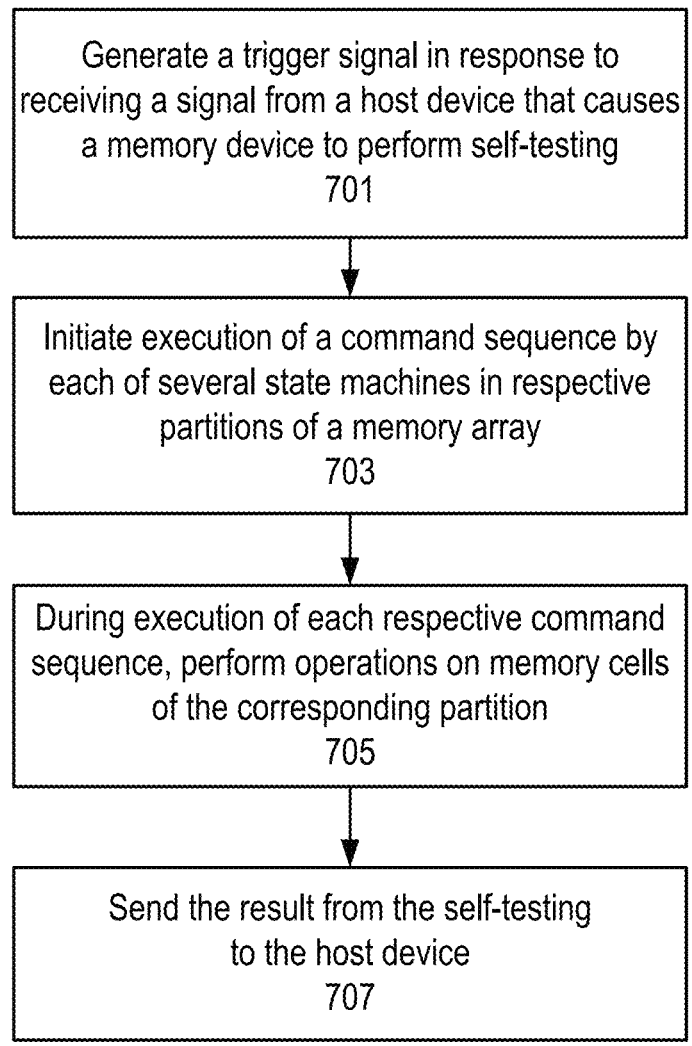
FIG. 7 shows a method for operating a memory device in a test mode using one or more state machines, in accordance with some embodiments.

FIG. 7 shows a method for operating a memory device in a test mode using one or more state machines, in accordance with some embodiments. For example, the method of FIG. 7 can be implemented in the system of FIGS. 1, 2. In one example, the memory device is memory device 102.

The method of FIG. 7 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In one example, the processing logic includes control circuitry 112 and/or periphery circuitry 108 of FIG. 1, or control circuitry 220 of FIG. 2.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 701, a trigger signal is generated in response to a memory device receiving a signal from a host device. Receiving the signal causes the memory device to perform self-testing. In one example, the trigger signal is trigger signal 130. In one example, the memory device is memory device 102.

At block 703, the trigger signal is sent to one or more state machines. The trigger signal causes execution of a command sequence by each of the state machines. Each of the state machines is in a respective partition of a memory array of the memory device. The command sequence can be different for each state machine. The command sequence can be configured for each state machine using test mode registers (e.g., 224). In one example, the state machine is state machine 114, 222.

At block 705, during execution of each respective command sequence for a given state machine, operations are performed on memory cells of the corresponding partition. In one example, these operations are read, delay, or write operations in various orderings configured as desired. In one example, the command sequence is command sequence 122. In one example, the memory cells are memory cells 212.

At block 707, a result from the self-testing is sent to the host device. In one example, this is a data result from comparing expected data to actual data read from the memory cells. In one example, the host device is host device 106.

In one embodiment, an apparatus comprises: an input/output (I/O) interface (e.g., 104) configured to communicate with a host device; periphery circuitry (e.g., 108) (e.g., periphery logic) configured to receive a test mode sequence from the host device via the I/O interface, and to generate a trigger signal (e.g., 130) (e.g., a command enable signal) in response to receiving the test mode sequence; control circuitry (e.g., 112, 220) (e.g., partition control logic) configured to receive the trigger signal, wherein the control circuitry comprises a state machine (e.g., 114, 222), and the state machine is configured to initiate execution of a command sequence upon receiving the trigger signal; and a memory array (e.g., 120) comprising memory cells, wherein each cell has a unique address, and the command sequence comprises operations performed on the memory cells.

In one embodiment, the memory array is part of a memory device, and the trigger signal initiates a built-in self-test (GIST) process for the memory device.

In one embodiment, the command sequence is at least one operation (e.g., one operation, or a combination of two or more operations), and each operation is a read operation, a write operation, or a delay operation.

In one embodiment, the memory cells are located at an array address in the memory array, the array address is provided with the trigger signal to the control circuitry by the periphery circuitry, and the array address corresponds to an address (e.g., a logical address) provided by the host device with the trigger signal.

In one embodiment, the control circuitry comprises address latches configured to latch the array address from the periphery circuitry.

In one embodiment, the array address is held by the address latches until the command sequence is completed.

In one embodiment, the test mode sequence is a combination of write register commands and memory access commands.

In one embodiment, the I/O interface provides a data result to the host device in reply to the test mode sequence (e.g., the data result is a value read from memory cells) (e.g., the data result is in a compressed form indicating a pass-fail result from a comparison of expected data to received data).

In one embodiment, the host device provides a logical address with the test mode sequence, the periphery circuitry provides a physical address (e.g., x, y address) to the control circuitry that corresponds to the logical address (e.g., a flash translation layer translates the logical address to the physical address), and the operations are performed on memory cells at the physical address in the memory array.

In one embodiment, the memory array comprises memory partitions (e.g., P0-P31), and the control circuitry is configured to control voltages (e.g., Vdm) used for operations on memory cells in a targeted partition.

In one embodiment, the voltages include read and write voltages applied to memory cells in the targeted partition.

In one embodiment, each partition comprises a respective state machine; the periphery circuitry generates a respective trigger signal for each of the partitions; and the respective trigger signal initiates execution of a command sequence by the respective state machine in the corresponding partition.

In one embodiment, the apparatus further comprises registers (e.g., test mode registers 224) to store parameters provided by the periphery circuitry with the trigger signal, and the parameters specify an order of operations (e.g., using opcodes) in the command sequence.

In one embodiment, the parameters further specify at least one voltage corresponding to the operations in the command sequence.

In one embodiment, the parameters further specify data to be written into the memory cells when performing a write operation of the command sequence.

In one embodiment, the memory array is part of a memory device configured to operate in a self-test mode and a user mode; the command sequence is executed during the self-test mode; and the operations performed on the memory cells during the self-test mode are the same as when performed in the user mode (e.g., write command is performed in the same way for the self-test mode and the user mode) (e.g., the write command is executed by the same microcode for either self-test mode or user mode).

In one embodiment, an apparatus comprises: a memory array comprising memory cells; logic circuitry (e.g., periphery logic) coupled to receive a test mode sequence sent by a host device to initiate self-testing associated with the memory cells, wherein the logic circuitry is configured to generate a trigger signal in response to receiving the test mode sequence from the host device; memory (e.g., 204) storing microcode (e.g., 206) configured to execute at least one of read, write, or delay operations; and control circuitry (e.g., partition control logic) configured to receive the trigger signal.

The control circuitry comprises a state machine; the state machine initiates execution of a command sequence in response to receiving the trigger signal; and the command sequence is executed using at least one of the read, write, or delay operations.

In one embodiment, the memory is a volatile or non-volatile memory.

In one embodiment, the control circuitry is further configured to update a program counter to cause execution of a portion of the microcode corresponding to at least one of the read, write, or delay operations in response to a change in a state of the state machine.

In one embodiment, the change in state is one of the following: a change from a read state to a delay state; a change from a delay state to a write state; a change from a write state to a read state; or a change from a read state to a write state.

In one embodiment, the memory array is part of a memory device configured to perform a self-test (e.g., BIST), and the state machine is configured for use only when performing the self-test.

In one embodiment, the apparatus further comprises row and column decoders used to access memory cells in the memory array, wherein the control circuitry is further configured to, after receiving the trigger signal, provide control signals to the row and column decoders to select the memory cells.

In one embodiment, the logic circuitry is further configured to generate at least one read enable signal (e.g., 240) after generating the trigger signal; the read enable signal is provided to the control circuitry; in response to receiving the read enable signal, the control circuitry causes sensing circuitry to sense data stored in the memory cells.

In one embodiment, the apparatus further comprises at least one counter configured to implement a configurable time delay between the trigger signal and the read enable signal.

In one embodiment, the at least one read enable signal is a plurality of read enable signals, and each respective read enable signal causes sensing of data for a respective one of a plurality of columns in a first partition of the memory array.

In one embodiment, the at least one read enable signal is sent to a state machine causing the state machine to generate consecutive enable signals for enabled states, and each enabled state includes a read, write, or delay operation.

In one embodiment, the logic circuitry is further configured to generate trigger signals for multiple partitions of the memory array in response to receiving the test mode sequence from the host device; and each of the multiple partitions comprises control circuitry including a state machine configured to execute a command sequence for testing.

In one embodiment, the state machine in each of the multiple partitions executes its respective command sequence independently of the state machines in other ones of the multiple partitions.

In one embodiment, each state machine executes a different respective command sequence (e.g., read/delay/write) (e.g., write/read/delay/write) based on parameters configured by register write operations as part of the test mode sequence.

In one embodiment, the state machine is enabled by setting a test mode bit in a register.

In one embodiment, the memory array is configured in a memory device having a user mode and a test mode; the write operation is configured to use a first voltage parameter when operating in the user mode; the state machine executes the command sequence in the test mode; and enabling the state machine causes overwriting of the first voltage parameter by a second voltage parameter used by the state machine when using the write operation as part of executing the command sequence.

In one embodiment, a method comprises: generating a trigger signal in response to receiving a signal (e.g., a command or test mode sequence) from a host device, the signal to cause a memory device to perform self-testing; in response to receiving the trigger signal, initiating execution of a respective command sequence by each of a plurality of state machines in respective partitions of a memory array; during execution of each respective command sequence, perform operations on memory cells of the corresponding partition; and send, to the host device, a result from the self-testing.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:
an input/output (I/O) interface configured to communicate with a host device;

periphery circuitry configured to receive a test mode sequence from the host device via the I/O interface, and to generate a trigger signal in response to receiving the test mode sequence;

control circuitry configured to receive the trigger signal, wherein the control circuitry comprises a state machine, and the state machine is configured to initiate execution by the control circuitry of a command sequence upon receiving the trigger signal; and a memory array comprising memory cells, wherein each cell has a unique address, and the command sequence specifies an order of operations performed on the memory cells.

2. The apparatus of claim 1, wherein the memory array is part of a memory device, and the trigger signal initiates a built-in self-test (BIST) process for the memory device.

3. The apparatus of claim 1, wherein the command sequence is at least one operation, and wherein each operation is a read operation, a write operation, or a delay operation.

4. The apparatus of claim 1, wherein the memory cells are located at an array address in the memory array, the array address is provided with the trigger signal to the control circuitry by the periphery circuitry, and the array address corresponds to an address provided by the host device with the trigger signal.

5. The apparatus of claim 4, wherein the control circuitry comprises address latches configured to latch the array address from the periphery circuitry.

6. The apparatus of claim 5, wherein the array address is held by the address latches until the command sequence is completed.

7. The apparatus of claim 1, wherein the test mode sequence is a combination of write register commands and memory access commands.

8. The apparatus of claim 7, wherein the I/O interface provides a data result to the host device in reply to the test mode sequence.

9. The apparatus of claim 1, wherein the host device provides a logical address with the test mode sequence, the periphery circuitry provides a physical address to the control circuitry that corresponds to the logical address, and the operations are performed on memory cells at the physical address in the memory array.

10. The apparatus of claim 1, wherein the memory array comprises memory partitions, and the control circuitry is configured to control voltages used for operations on memory cells in a targeted partition.

11. The apparatus of claim 10, wherein the voltages include read and write voltages applied to memory cells in the targeted partition.

12. The apparatus of claim 10, wherein:
each partition comprises a respective state machine;
the periphery circuitry generates a respective trigger signal for each of the partitions; and
the respective trigger signal initiates execution of a command sequence by the respective state machine in the corresponding partition.

13. The apparatus of claim 1, further comprising registers to store parameters provided by the periphery circuitry with the trigger signal, wherein the parameters specify an order of operations in the command sequence.

14. The apparatus of claim 13, wherein the parameters further specify at least one voltage corresponding to the operations in the command sequence.

15. The apparatus of claim 13, wherein the parameters further specify data to be written into the memory cells when performing a write operation of the command sequence.

16. The apparatus of claim 1, wherein:
the memory array is part of a memory device configured to operate in a self-test mode or a user mode;
the command sequence is executed during the self-test mode; and
the operations performed on the memory cells during the self-test mode are the same as when performed in the user mode.

17. An apparatus comprising:
a memory array comprising memory cells;
logic circuitry coupled to receive a test mode sequence sent by a host device to initiate self-testing associated with the memory cells, wherein the logic circuitry is configured to generate a trigger signal in response to receiving the test mode sequence from the host device; and
control circuitry configured to receive the trigger signal, wherein:
the control circuitry comprises a state machine;
the state machine initiates execution of a command sequence in response to receiving the trigger signal; and
the command sequence is executed by the control circuitry using at least one of read, write, or delay operations.

18. The apparatus of claim 17, further comprising a memory storing microcode, wherein the control circuitry is further configured to update a program counter to cause execution of a portion of the microcode corresponding to at least one of the read, write, or delay operations in response to a change in a state of the state machine.

19. The apparatus of claim 18, wherein the change in state is one of the following:
a change from a read state to a delay state;
a change from a delay state to a write state;
a change from a write state to a read state; or
a change from a read state to a write state.

20. The apparatus of claim 17, wherein the memory array is part of a memory device configured to perform a self-test, and the state machine is configured for use only when performing the self-test.

21. The apparatus of claim 17, further comprising row and column decoders used to access memory cells in the memory array, wherein the control circuitry is further configured to, after receiving the trigger signal, provide control signals to the row and column decoders to select the memory cells.

22. The apparatus of claim 17, wherein:
the logic circuitry is further configured to generate at least one read enable signal after generating the trigger signal;
the read enable signal is provided to the control circuitry; and
in response to receiving the read enable signal, the control circuitry causes sensing circuitry to sense data stored in the memory cells.

23. The apparatus of claim 22, further comprising at least one counter configured to implement a configurable time delay between the trigger signal and the read enable signal.

24. The apparatus of claim 22, wherein the at least one read enable signal is a plurality of read enable signals, each respective read enable signal causing sensing of data for a respective one of a plurality of columns in a first partition of the memory array.

25. The apparatus of claim 22, wherein the at least one read enable signal is sent to a state machine causing the state machine to generate consecutive enable signals for enabled states, and wherein each enabled state includes a read, write, or delay operation.

26. The apparatus of claim 17, wherein:
the logic circuitry is further configured to generate trigger signals for multiple partitions of the memory array in response to receiving the test mode sequence from the host device; and
each of the multiple partitions comprises control circuitry including a state machine configured to execute a command sequence for testing.

27. The apparatus of claim 26, wherein the state machine in each of the multiple partitions executes its respective command sequence independently of the state machines in other ones of the multiple partitions.

28. The apparatus of claim 27, wherein each state machine executes a different respective command sequence based on parameters configured by register write operations as part of the test mode sequence.

29. The apparatus of claim 17, wherein the state machine is enabled by setting a test mode bit in a register.

30. The apparatus of claim 29, wherein:
the memory array is configured in a memory device having a user mode and a test mode;
the write operation is configured to use a first voltage parameter when operating in the user mode;
the state machine executes the command sequence in the test mode; and
enabling the state machine causes overwriting of the first voltage parameter by a second voltage parameter used by the state machine when using the write operation as part of executing the command sequence.

31. A method comprising:
generating a trigger signal in response to receiving a signal from a host device, the signal to cause a memory device to perform self-testing;
in response to receiving the trigger signal, initiating execution of a respective command sequence by each of a plurality of state machines in respective partitions of a memory array;
during execution of each respective command sequence, perform operations on memory cells of the corresponding partition; and
send, to the host device, a result from the self-testing.

\* \* \* \* \*